(12) United States Patent
Oles

(10) Patent No.: US 6,344,149 B1
(45) Date of Patent: Feb. 5, 2002

(54) POLYCRYSTALLINE DIAMOND MEMBER AND METHOD OF MAKING THE SAME

(75) Inventor: Edward J. Oles, Ligonier, PA (US)

(73) Assignee: Kennametal PC Inc., Monrovia, CA (US)

( * ) Notice: Subject to any disclaimer, the term of this patent is extended or adjusted under 35 U.S.C. 154(b) by 0 days.

(21) Appl. No.: 09/189,484

(22) Filed: Nov. 10, 1998

(51) Int. Cl.$^7$ ............................................ B44C 1/22
(52) U.S. Cl. ..................... 216/11; 216/56; 216/108; 427/212; 427/249; 427/307
(58) Field of Search ........................... 216/11, 56, 100, 216/108; 205/640; 407/119

(56) References Cited

U.S. PATENT DOCUMENTS

| | | | |
|---|---|---|---|
| 4,225,322 A | 9/1980 | Kuemeyer | 51/295 |
| 4,572,722 A | 2/1986 | Dyer | 51/309 |

(List continued on next page.)

FOREIGN PATENT DOCUMENTS

| | | | |
|---|---|---|---|
| EP | 0487292 | | 5/1992 |
| EP | 0619382 | | 10/1994 |
| GB | 1598837 | * | 9/1981 |
| GB | 2311084 | | 9/1997 |
| JP | 6369971 | | 3/1988 |
| JP | 0354180 | | 3/1991 |
| JP | 3054180 | | 3/1991 |
| JP | 59-219500 A2 | * | 12/1994 |
| JP | 63-69971 A2 | * | 3/1998 |
| WO | 9323204 | | 11/1993 |

OTHER PUBLICATIONS

Vinogradov, A. Yu. et al "Method of revealing the grain of diamond tools in a metallic binder" Stanki Instrum. 1977 (2)20–1, abstract only.*

International Search Report PCT/US99/24267 [mailed by the ISA on Feb. 17, 2000].

Suzuki et al., Diamond Deposition on WC–Co Cemented Carbide by Hot–Filament Method J. Jpn. Soc. Powder Metall. (1986) vol. 33 pp. 38–45.

Shibuki et al., Abhesion Strength of Diamond Films on Cemented Carbide Substrates, Surface and Coatings Technology,36 (1988) pp. 295–302.

Park et al., Behavior of Co bivder phase during diamond deposition on WC–co Substrate, Diamond and Related Materials, 2 (1993) pp. 910–917.

Haubner et al., Diamond growth by hot–filament chemical vapor deposition: state of the art, Diamond and Related Materials, 2 (1993) pp. 1277–1294.

Nesladek et al., Improved adhesion of CVD diamond films to steel and WC–Co substrates, Diamond and Related Materials, 3 (1993) pp. 98–104.

*Primary Examiner*—Randy Gulakowski
*Assistant Examiner*—Allan Olsen
(74) *Attorney, Agent, or Firm*—John J. Prizzi

(57) ABSTRACT

A polycrystalline diamond member and a method for making the same. The member includes a backing and a layer of polycrystalline diamond on the backing wherein the layer of polycrystalline diamond has a rake surface and a flank surface. The layer of polycrystalline diamond has an interior region adjacent to the backing and an exterior region adjacent to the interior region wherein the exterior region terminates at the rake surface. The interior region includes interior diamond particles and a catalyst with the interior diamond particles being bridged together so as to form interstices therebetween. The catalyst is at the interstices of the interior diamond particles. The exterior region includes exterior diamond particles bridged together so as to form interstices therebetween with the exterior region being essentially free of the catalyst. A chemical vapor deposition-applied hard material essentially surrounds the exterior diamond particles.

21 Claims, 3 Drawing Sheets

U.S. PATENT DOCUMENTS

| | | | |
|---|---|---|---|
| 4,604,106 A | 8/1986 | Hall et al. | 51/293 |
| 4,655,508 A | 4/1987 | Tomlinson | 299/79 |
| 4,664,705 A | 5/1987 | Horton et al. | 75/243 |
| 4,731,296 A | 3/1988 | Kikuchi et al. | 428/552 |
| 4,882,138 A | 11/1989 | Pinneo | 423/446 |
| 4,919,974 A | 4/1990 | McCune et al. | 427/249 |
| 5,006,203 A | 4/1991 | Purdes | 156/646 |
| 5,068,148 A | 11/1991 | Nakahara et al. | 428/335 |
| 5,075,095 A | 12/1991 | Pinneo | 423/446 |
| 5,139,372 A * | 8/1992 | Tanabe et al. | 407/118 |
| 5,147,687 A | 9/1992 | Garg et al. | 427/249 |
| 5,173,089 A | 12/1992 | Tanabe et al. | 51/293 |
| 5,236,740 A | 8/1993 | Peters et al. | 427/249 |
| 5,270,114 A | 12/1993 | Herb et al. | 428/403 |
| 5,271,971 A | 12/1993 | Herb et al. | 427/577 |
| 5,273,790 A | 12/1993 | Herb et al. | 427/577 |
| 5,273,825 A | 12/1993 | Herb et al. | 428/408 |
| 5,277,975 A | 1/1994 | Herb et al. | 428/378 |
| 5,284,709 A | 2/1994 | Herb et al. | 428/408 |
| 5,304,424 A | 4/1994 | Herb et al. | 428/403 |
| 5,316,842 A | 5/1994 | Herb et al. | 428/319.1 |
| 5,318,836 A | 6/1994 | Ito et al. | 428/323 |
| 5,334,453 A | 8/1994 | Iio et al. | 428/408 |
| 5,370,912 A | 12/1994 | Bigelow et al. | 427/575 |
| 5,380,408 A * | 1/1995 | Svensson | 216/52 |
| 5,413,772 A | 5/1995 | Pinneo | 423/446 |
| 5,418,018 A | 5/1995 | Rudder et al. | 427/577 |
| 5,427,827 A | 6/1995 | Shing et al. | 427/577 |
| 5,464,665 A | 11/1995 | Anthony et al. | 427/570 |
| 5,482,748 A | 1/1996 | Soderberg et al. | 427/577 |
| 5,491,028 A | 2/1996 | Sarin et al. | 428/408 |
| 5,496,596 A | 3/1996 | Herb et al. | 427/577 |
| 5,518,766 A | 5/1996 | Bigelow et al. | 427/255.7 |
| 5,543,210 A * | 8/1996 | Kullander et al. | 428/217 |
| 5,545,030 A | 8/1996 | Pinneo | 428/408 |
| 5,560,839 A | 10/1996 | Bennett et al. | 216/100 |
| 5,567,242 A | 10/1996 | Soderberg et al. | 118/723 |
| 5,567,526 A | 10/1996 | Peters et al. | 428/408 |
| 5,584,045 A * | 12/1996 | Tanabe et al. | 428/547 |
| 5,585,176 A * | 12/1996 | Grab et al. | 428/336 |
| 5,609,955 A | 3/1997 | Pinneo | 428/323 |
| 5,614,140 A | 3/1997 | Pinneo | 264/81 |
| 5,618,625 A | 4/1997 | Okamura | 428/408 |
| 5,633,088 A | 5/1997 | Pinneo | 428/408 |
| 5,635,256 A * | 6/1997 | Olson | 427/535 |
| 5,653,812 A | 8/1997 | Petrmichl et al. | 118/723 E |
| 5,660,881 A | 8/1997 | Okamura | 427/249 |
| 5,674,620 A | 10/1997 | Pujia et al. | 428/408 |
| 5,700,518 A | 12/1997 | Lee et al. | 427/249 |
| 5,716,170 A | 2/1998 | Kammermeier et al. | 408/145 |
| 5,720,808 A | 2/1998 | Hirabayashi et al. | 117/103 |
| 5,833,021 A * | 11/1998 | Mensa-Wilmot et al. | 175/433 |
| 5,902,675 A | 5/1999 | Pinneo | 428/323 |
| 5,976,205 A * | 11/1999 | Andrews et al. | 51/307 |
| 6,042,886 A * | 3/2000 | Matthee et al. | 427/249.11 |

\* cited by examiner

POLYCRYSTALLINE DIAMOND MEMBER AND METHOD OF MAKING THE SAME

BACKGROUND

The invention pertains to a polycrystalline diamond member, and in particular, to a polycrystalline diamond member having a backing of polycrystalline diamond and a layer of a hard chemical vapor deposition (CVD) coating, i.e., a hard material applied by CVD techniques, on the backing.

Heretofore, a typical polycrystalline diamond compact comprises a backing of tungsten carbide (or cobalt cemented tungsten carbide) and a polycrystalline diamond layer on the backing. The polycrystalline diamond layer comprises diamond particles bridged together (i.e., bonded together by bridging) with a catalyst (e.g., cobalt) at the interstices of the diamond particles. The cobalt acts as a catalyst for the bridging together of the diamond particles. Such a polycrystalline diamond compact is shown and described in U.S. Pat. No. 4,604,106 to Hall et al. for a COMPOSITE POLYCRYSTALLINE DIAMOND COMPACT, wherein the Hall et al. patent is hereby incorporated by reference herein. Although it depends upon the specific application for use, in the case of use as a polycrystalline diamond (PCD) blank for a PCD cutting insert, these polycrystalline diamond compacts are cut into sections and then polished to some extent to form a PCD blank whereby the PCD blank is then brazed into a pocket in a substrate for the PCD cutting insert. The PCD blank has a rake surface and flank surfaces which intersect to define the cutting edges of the PCD cutting insert. The typical PCD blank has a catalyst (e.g., cobalt) content between about 5 weight percent and about 6 weight percent and the average particle size of the diamond particles varies depending upon the application. The broader range for the average particle size of the diamond particles may be between about 2 micrometers ($\mu$m) and about 25 $\mu$m with other ranges of between about 2 $\mu$m and about 10 $\mu$m and between about 10 $\mu$m and about 25 $\mu$m.

In a co-pending U.S. patent application by E. J. Oles and L. E. Thomas entitled CUTTING INSERT WITH IMPROVED FLANK SURFACE ROUGHNESS AND METHOD OF MAKING, which is hereby incorporated by reference herein, and assigned to the assignee (Kennametal Inc. of Latrobe, Pa. 15650, USA) of this patent application, there is disclosed a PCD cutting insert which includes a PCD blank. The PCD blank has a rake surface that has been roughened using ion milling, laser or plasma etching so as to achieve a surface roughness sufficient to provide for microscopic chip control during a material removal process. The PCD blank has been finish-ground so that on the flank surfaces there are the finish-grind lines therein which lie in a direction that is generally parallel to the cutting edges, and the flank surfaces have been polished so that they have a mirror finish (less than 5 microinches, $R_a$). Such a PCD cutting insert provides for microscopic chip control due to the roughened rake surface and also provides a workpiece surface finish that approaches theoretical values due to the smoothness of the flank surfaces.

While the above-described earlier PCD cutting insert provides certain advantages and it is a very satisfactory PCD cutting insert, certain aspects for improvement still remain.

In the above-described earlier PCD cutting insert, the surface which contacts the workpiece during the material removal process is not especially made for contacting the workpiece surface. In other words, the microstructure of the diamond layer of the earlier PCD blank is generally consistent throughout. It would be highly desirable to provide a PCD cutting insert that has a PCD blank with a surface which contacts the workpiece that has been especially made to accommodate such contact, and wherein the PCD blank also provides for microscopic chip control and a workpiece surface finish that approaches theoretical values.

In the above-described earlier PCD cutting insert, the rake surface achieves its roughness through a separate roughening step such as ion milling, plasma etching or laser blading. It would be highly desirable to provide a PCD cutting insert with a PCD blank with a roughened rake surface wherein the roughness is not formed by a separate processing step, and wherein the PCD blank also provides for microscopic chip control and a workpiece surface finish that approaches theoretical values.

SUMMARY

In one form thereof, the invention is a polycrystalline diamond member which includes a backing, and a layer of polycrystalline diamond on the backing wherein the layer of polycrystalline diamond has a rake surface and a flank surface. The layer of polycrystalline diamond has an interior region adjacent to the backing and an exterior region adjacent to the interior region wherein the exterior region terminates at the rake surface. The interior region comprises interior diamond particles and a catalyst wherein the interior diamond particles are bridged together so as to form interstices therebetween, and the catalyst is at the interstices of the interior diamond particles. The exterior region comprises exterior diamond particles bridged together so as to form interstices therebetween and the exterior region is essentially free of the catalyst. A chemical vapor deposition-applied hard material essentially surrounds the exterior diamond particles.

In another form thereof, the invention is a polycrystalline diamond cutting insert which comprises a substrate that contains a pocket therein. A polycrystalline diamond blank has a backing and a layer of polycrystalline diamond on the backing. The layer of polycrystalline diamond has an interior region adjacent to the backing and an exterior region adjacent to the interior region. The interior region comprises interior diamond particles and a catalyst wherein the interior diamond particles are bridged together so as to form interstices therebetween. The catalyst is at the interstices of the interior diamond particles. The exterior region comprises exterior diamond particles bridged together so as to form interstices therebetween and the exterior region is essentially free of the catalyst. A chemical vapor deposition-applied hard material essentially surrounds the exterior diamond particles.

In still another form thereof, the invention is a method of making a polycrystalline diamond member comprising the steps of: providing a backing; providing a polycrystalline diamond layer on the backing wherein the polycrystalline diamond comprises a plurality of diamond particles and a catalyst with the diamond particles being bridged together so as to form interstices therebetween and the catalyst being at the interstices of the diamond particles; removing the catalyst from the polycrystalline diamond layer beginning at a portion of the surface of the polycrystalline diamond layer to a predetermined depth so as to form: an exterior region comprising exterior ones of the diamond particles bridged together so as to form interstices therebetween, and the exterior region being essentially free of the catalyst, and an interior region inwardly of the exterior region, and the interior region comprising interior ones of the diamond particles and a catalyst, and the interior diamond particles being bridged together so as to form interstices therebetween, and the catalyst being at the interstices of the interior diamond particles; and depositing beginning at the portion of the surface of the polycrystalline diamond layer a volume of hard material whereby the rate of deposition is sufficiently slow so as to permit the hard material to infiltrate between the bridged-together exterior diamond particles so as to essentially surround the exterior diamond particles whereby the exterior region comprises exterior diamond particles bridged together with the hard material essentially surrounding the exterior diamond particles.

In yet another form thereof, the invention is a method of making a polycrystalline diamond cutting insert comprising the steps of: providing a substrate having a pocket therein; providing a polycrystalline diamond blank having a backing with a polycrystalline diamond layer on the backing wherein the polycrystalline diamond layer has a rake surface and a flank surface which intersect to form a cutting edge, and the polycrystalline diamond layer comprises a plurality of diamond particles and a catalyst with the diamond particles being bridged together so as to form interstices therebetween and the catalyst being at the interstices between the diamond particles; removing the catalyst from the polycrystalline diamond layer beginning at a portion of the surface of the polycrystalline diamond layer to a predetermined depth so as to form: an exterior region comprising exterior ones of the diamond particles bridged together so as to form interstices therebetween, and the exterior region being essentially free of the catalyst, and an interior region inwardly of the exterior region and the interior region comprising interior ones of the diamond particles being bridged together so as to from interstices therebetween and the catalyst, and the catalyst being at the interstices between the interior diamond particles; depositing beginning at the portion of the surface of the polycrystalline diamond layer a volume of hard material whereby the rate of deposition is sufficiently slow so as to permit the hard material to infiltrate between the bridged-together exterior diamond particles whereby the exterior region comprises the exterior diamond particles bridged together with the hard material essentially surrounding the exterior diamond particles; brazing the polycrystalline blank into the pocket; and finish-grinding the flank surface of the polycrystalline diamond layer so that the finish-grind lines lie in a direction generally parallel to the cutting edge.

BRIEF DESCRIPTION OF THE DRAWINGS

The following is a brief description of the drawings which form a part of this patent application.

DETAILED DESCRIPTION

The present invention pertains to a polycrystalline diamond member including a PCD blank for a cutting insert, a PCD cutting insert utilizing a PCD blank, a wire die, a wear surface, wear members for rock cutting equipment, and wear members for drilling equipment. Broadly speaking and as will become apparent from the description hereinafter, the polycrystalline diamond member has a backing on which there is a polycrystalline diamond layer. The polycrystalline diamond layer has an exterior region which comprises diamond particles (i.e., exterior diamond particles) bridged together (i.e., bonded together by bridging) with a hard material (e.g., diamond) applied by CVD surrounding (and mechanically adhering to) the exterior diamond particles so there are no voids in the exterior region. The polycrystalline diamond layer also has an interior region between the backing and the exterior region wherein the interior region includes diamond particles (i.e., interior diamond particles) bridged together with a metallic catalyst (e.g., cobalt) at the interstices of the diamond particles.

Broadly speaking and as will become apparent from the description hereinafter, the process of making the polycrystalline diamond member comprises the steps of: (1) providing a PCD blank with a backing and a polycrystalline diamond layer on the backing wherein the polycrystalline diamond comprises a plurality of diamond particles bridged together and the catalyst at the interstices of the diamond particles; (2) removing the catalyst from the polycrystalline diamond surface beginning at one or more selected portions of the surface of the polycrystalline diamond layer to a predetermined depth so as to form: (a) an exterior region comprising the diamond particles (i.e., exterior diamond particles) bridged together and being essentially free of the catalyst (i.e., cobalt), and (b) an interior region inwardly of the exterior region and the interior region comprising the diamond particles (i.e., interior diamond particles) and the catalyst with the interior diamond particles being bridged together and the catalyst at the interstices of the diamond particles; and (3) depositing via CVD techniques beginning at the portion of the surface of the polycrystalline diamond layer a volume of a hard material (e.g., diamond) whereby the rate of deposition is sufficiently slow so as to permit the CVD hard material to infiltrate between (and mechanically adhere to) the bridged-together diamond particles in the exterior region whereby the exterior region comprises exterior diamond particles bridged together with the hard material surrounding the bridged-together diamond particles.

Figure 1:
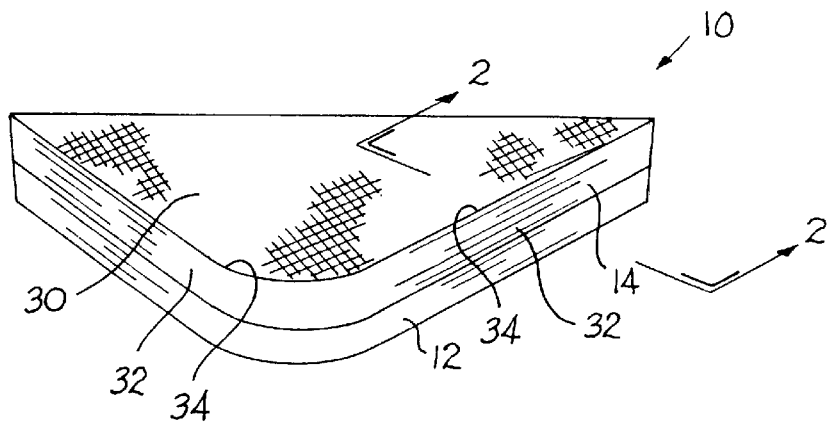
FIG. 1 is an isometric view of a conventional PCD blank used in connection with a PCD cutting insert wherein the PCD blank has a backing and a layer of polycrystalline diamond thereon.
Figure 2:
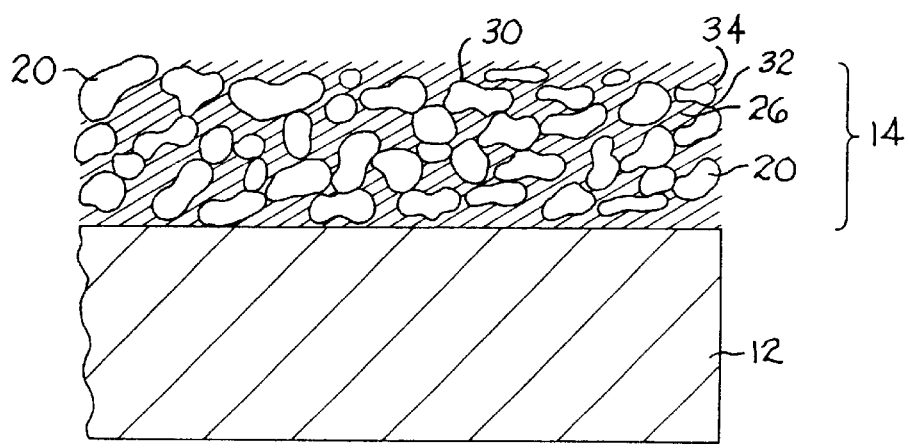
FIG. 2 is a cross-sectional schematic view of a part of the microstructure of the PCD blank of FIG. 1 taken along section 2—2 of FIG. 1 wherein the PCD blank has a backing and a polycrystalline diamond layer on the backing wherein the polycrystalline diamond layer comprises diamond particles bridged together and a catalyst (i.e., cobalt) at the interstices between the diamond particles.

Referring to FIGS. 1 and 2 there is shown a conventional polycrystalline (PCD) blank generally designated as 10 and being of a generally triangular geometry. PCD blank 10 includes a backing layer 12 which preferably comprises a tungsten carbide-cobalt material. Applicant contemplates that other suitable material may comprise the backing layer 12. PCD blank 10 further comprises a polycrystalline diamond layer 14 which comprises a plurality of diamond crystals (or particles) 20 (see FIG. 2) bridged together so as to form interstices therebetween and having a catalyst material 26 filling (or being at) the interstices of the diamond crystals 20. The preferred catalyst material 26 is cobalt, but applicant contemplates that other suitable materials are within the scope of the invention.

As illustrated by FIG. 2, the catalyst 26 extends to the rake surface 30 of the diamond layer 14. The PCD blank 10 also presents flank surfaces 32. The rake surface 30 and the flank surfaces 32 intersect to form cutting edges 34 at the juncture thereof. It should be appreciated that the PCD blank 10 may be made by conventional methods such as, for example, by those disclosed in U.S. Pat. No. 4,604,106 to Hall et al., which is hereby incorporated by reference herein.

Figure 3:
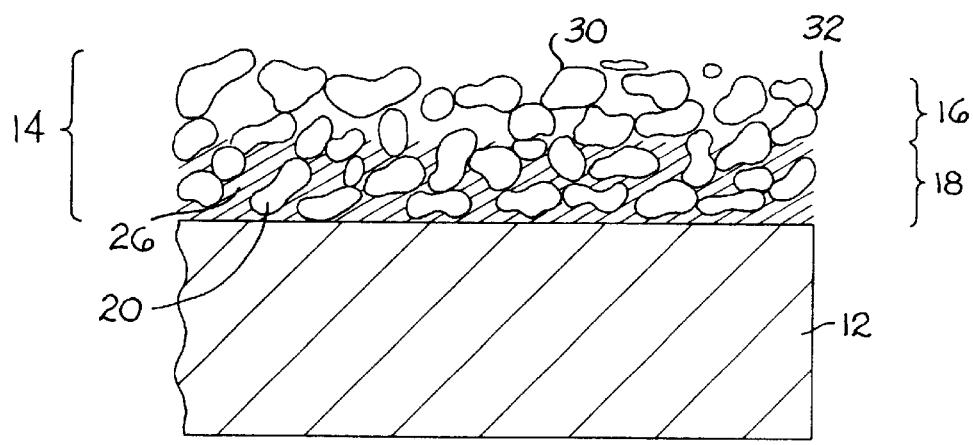
FIG. 3 is a cross-sectional schematic view of the PCD blank like that of FIG. 2, but where a layer of the catalyst (i.e., cobalt) has been removed from only the rake surface of the polycrystalline diamond layer so as to create a region which is essentially free of the catalyst (i.e., cobalt) and in which the diamond particles are bridged together.

Referring to FIG. 3, after providing the PCD blank 10, the next step in the process is to remove essentially all of the catalyst material 26 from the region(s) of the polycrystalline diamond layer 14 near one or more selected portions of the surface. The result of the removal step is to form in the polycrystalline diamond layer 14 an exterior region 16 and an interior region 18, which are described in more detail hereinafter, wherein these regions have different microstructures.

In the specific embodiment shown in FIG. 3, the catalyst 26 is removed from only the rake surface 30 of the polycrystalline diamond layer 14 and the catalyst 26 is not directly removed from the flank surface 32. However, even though the catalyst is not directly removed from the flank surface 32, the exterior region 16 extends to the flank surface 32 near the point where the rake surface 30 and the flank surface 32 intersect to form the cutting edge 34.

The actual process to accomplish this removal may be an electrochemical process or an acid treatment. As an example of an acid treatment, the blank may be dipped in a solution of one part $HNO_3$ and three parts water at 40° C. for about 15 minutes. This process (i.e., acid treatment) or an electrochemical process would result in an essentially catalyst-free surface. The electrochemical process is preferred since such a process would be self-arresting due to the fact that the diamond remaining after the removal of the metallic catalyst (e.g., cobalt) is an insulator.

Still referring to FIG. 3, it can be seen that the removal of the catalyst 26 from the rake surface 30 has created an exterior region 16 in which there is essentially no catalyst (cobalt) but only the diamond particles 20 (or exterior diamond particles) bridged together (i.e., bonded together by bridging). The removal of the catalyst 26 has also created an interior region 18 which still contains catalyst 26 surrounding the bridged-together diamond particles 20 (or interior diamond particles). The interior region 18 extends to the flank surface 32.

Figure 4:
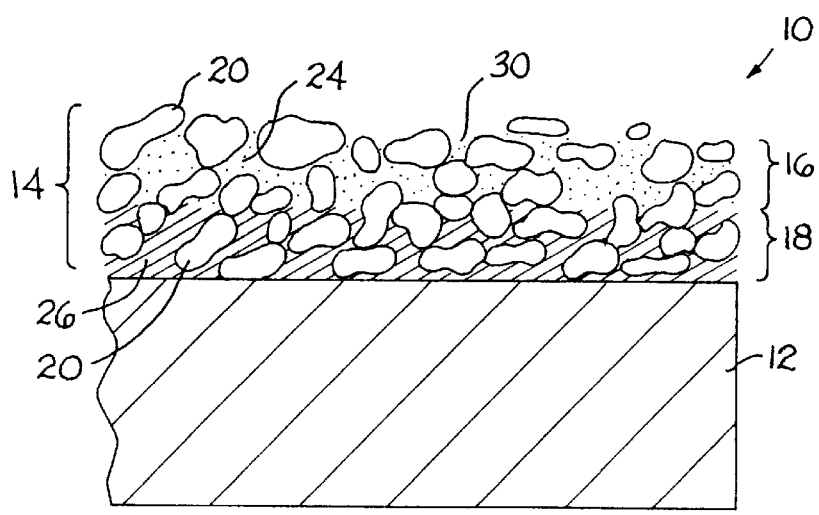
FIG. 4 is a cross-sectional schematic view of the PCD blank like that of FIG. 3, but where a layer of CVD diamond has been deposited on the rake surface of the polycrystalline diamond layer so as to infiltrate between (and mechanically adhere to) the diamond particles in the region which is essentially free of the catalyst (i.e., cobalt)

Referring to FIG. 4, the next step in the process is to apply via a CVD process a diamond coating to the rake surface 30 of the PCD blank 10 illustrated in FIG. 3. The deposition rate of the diamond material should be slow enough so that the diamond material infiltrates the catalyst-free exterior region and surrounds the diamond particles so that there are essentially no voids in the exterior region comprising the diamond particles and diamond material. It is preferable that the diamond material also mechanically adheres to the diamond particles. The above-described degree of infiltration and mechanical adherence should occur if the deposition rate is less than about one micron per hour, and more preferably less than about 0.5 microns per hour. The infiltration is also enhanced if the particle size of the diamond material is small enough so that the diamond particles easily move into the interstices between the exterior diamond particles. In this regard, one preferred average particle size for these diamond particles is between about 10 $\mu$m and 15 $\mu$m.

Referring to the deposition techniques, although a number of deposition techniques may be acceptable, acceptable deposition techniques are generally described and disclosed in U.S. Pat. No. 5,482,748 to Soderberg et al. for a METHOD FOR DIAMOND COATING BY MICROWAVE PLASMA (which is hereby incorporated by reference herein), the article by Haubner et al. entitled "Diamond growth by hot-filament chemical vapor deposition: state of the art," *Diamond and Related Materials*, 2 (1993), pages 1277–1294 (which is hereby incorporated by reference herein) provided that the deposition rate is sufficiently slow to achieve adequate infiltration as described above. The result of the diamond deposition step is that the exterior region 16 comprises the diamond particles 20 bridged together and having the CVD diamond material 24 surrounding the diamond particles 20, as well as mechanically adhering to the diamond particles 20.

Still referring to FIG. 4, the diamond particles 20 near the rake surface 30 of the polycrystalline diamond layer 14 protrude slightly from the rake surface so as to create a surface roughness. This surface roughness is on the order of greater than 15 microinches, $R_a$, and more preferably, on the order of greater than 30 microinches, $R_a$. To some extent the diamond crystals protrude from the flank surface 32 at the point near the intersection of the rake surface 30 and the flank surface 32. However, as will be described hereinafter, once the PCD blank has been affixed to the PCD cutting insert, the flank surfaces 32 may be finish-ground and polished so as to remove any surface roughness caused by the protrusion of the diamond particles.

Figure 5:
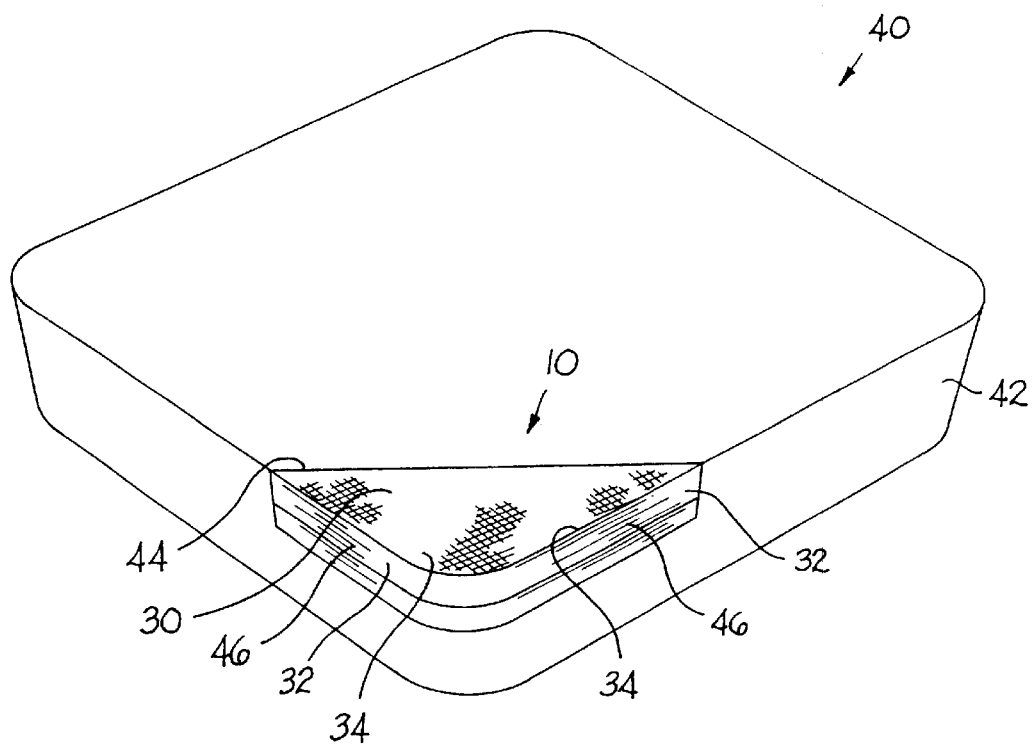
FIG. 5 is an isometric view of a PCD cutting insert wherein the PCD cutting insert has a substrate with a pocket that receives the PCD blank of FIG. 4.

FIG. 5 illustrates a PCD cutting insert generally designated as 40 having the generally triangular PCD blank 10 made according to the above process. The PCD cutting insert 40 has a substrate 42 which contains a pocket 44. The PCD blank 10 is affixed (e.g., brazed) into the pocket 44. The PCD blank 10 has a polycrystalline diamond layer 14 with a rake surface 30. The diamond layer 14 is on the top surface of a the backing 12. The diamond layer 14 also presents flank surfaces 32 which intersect with the rake surface 30 to form cutting edges 34.

After the PCD blank 10 has been brazed into the pocket 44, each flank surface 32 thereof may be finish-ground so that the finish-grind lines 46 are generally parallel to the direction of its corresponding cutting edges 34. Each flank surface 32 is then polished so as to attain a surface roughness of less than five microinches, $R_a$. The rake surface 30 of the polycrystalline diamond layer 14 has a CVD layer from the exterior region of the diamond layer protruding therefrom so as to create a surface roughness sufficient to achieve microscopic chip control.

Because the exterior region 16 of the polycrystalline diamond layer 14 comprises diamond particles and a CVD diamond coating surrounding the diamond particles, the exterior region, and hence, the surface of the exterior region 16 of the polycrystalline diamond layer 14, is especially suited for contacting the workpiece surface. The portions of the polycrystalline diamond layer 14 which have the diamond particles in the diamond material 24 are the rake surface 30 and a portion of the flank surface 32 in the vicinity of the intersection of the rake surface 30 and the flank surface 32, i.e., the cutting edge 34.

It can thus be appreciated that the PCD cutting insert 40 will provide a PCD blank 10 with a rake surface 30 wherein the roughness provides for microscopic chip control and a flank surface 32 which has a surface finish that provides for a workpiece surface finish that approaches theoretical values. It can also be appreciated that the PCD cutting insert 40 will provide a PCD blank 10 wherein the rake surface 30 and the portion of the flank surface 32 adjacent to the cutting edge 34 (which includes the cutting edge 34) is especially suited for contacting the workpiece during a material removal operation.

The specific embodiment illustrated in FIGS. 3 and 4 occurred as a result of the removal of the cobalt catalyst from only the rake surface of the PCD blank. In another embodiment, the catalyst (cobalt) may be removed from both the rake surface and the flank surface of the PCD blank.

Figure 6:
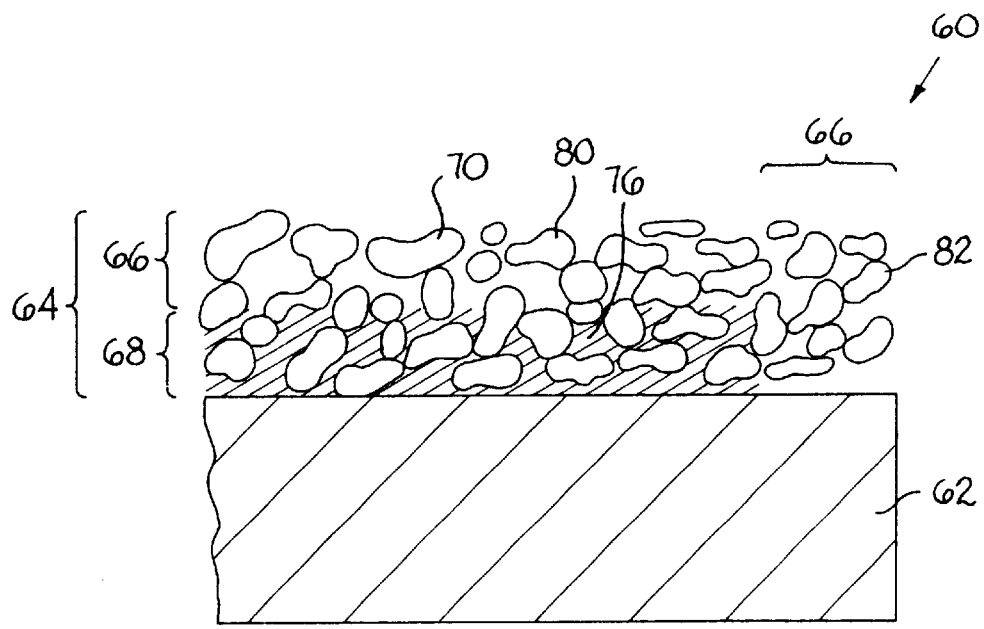
FIG. 6 is a cross-sectional schematic view of a portion of a PCD blank like that of FIG. 2, but where a layer of the catalyst (i.e., cobalt) has been removed from the rake surface and the flank surface of the polycrystalline diamond layer so as to create a region which is essentially free of the catalyst (i.e., cobalt) and in which the diamond particles are bridged together.
Figure 7:
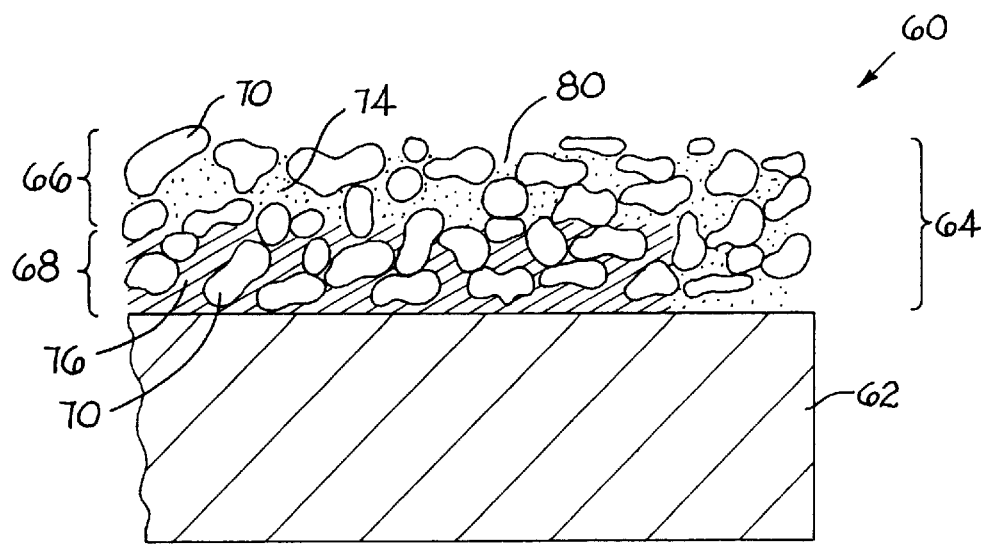
FIG. 7 is a cross-sectional view of a PCD blank like that of FIG. 6, but where a layer of diamond has been deposited on the rake surface and the flank surface of the polycrystalline diamond layer so as to infiltrate between (and mechanically adhere to) the diamond crystals in the region which is essentially free of the catalyst (i.e., cobalt).

In this regard and referring to FIGS. 6 and 7, there is illustrated in FIG. 6 a cross-section of the PCD blank 60 which has had the catalyst (i.e., cobalt) removed from the portions of the polycrystalline diamond layer 64 near the rake surface 80 and the flank surface 82. Thus, it can be seen that there is a portion of the exterior region 66 which extends along the entire rake surface and another portion of the exterior region 66 which extend along the entire flank surface 82. These exterior regions 66 are essentially cobalt (or catalyst)-free and comprise particles of diamond bridged together. The interior region 68 is contained between the exterior region 66 and the surface of the backing 62. The interior region 68 does not extend to the rake surface 80 or the flank surface 82.

FIG. 7 shows the cross-section of the PCD blank 60 of FIG. 6 wherein a diamond layer 74 has been applied to the flank surface 82 and the rake surface 80. The diamond layer 74 is initially applied at a rate of less than about one micron per hour (and more preferably at a rate of less than about 0.5 microns per hour) so that the diamond material 74 infiltrates between (and mechanically adheres to) the diamond particles 20 so as to create an exterior region 66 which extends inwardly from the rake surface 80 and from the flank surface 82.

In a fashion like that of FIG. 4, the diamond particles 70 protrude from the rake surface 80 and the flank surface 82. The rake surface 80 thus has a surface roughness on the order of greater than 15 microinches, $R_a$, and more preferably, on the order of greater than 30 microinches, $R_a$. The diamond particles 70 that protrude from the flank surface 82; however, as will be described hereinafter, the flank surface may be finish-ground and polished so as to remove any surface roughness caused by the protrusion of the diamond particles 70.

Like for the embodiment of FIG. 4, the PCD blank is brazed into a pocket of the substrate of a PCD cutting insert. The flank surface 82 of the PCD blank 60 is finish-ground, and then polished to achieve a surface roughness of less than 5 microinches, $R_a$, which provides for a workpiece surface finish that approaches the theoretical value. The rake surface 80 has a surface roughness sufficient to provide microscopic chip control. Hence, it is seen that the PCD cutting insert which uses the PCD blank formed from the PCD blank like FIG. 7 provides for microscopic chip control and a workpiece surface finish approaching theoretical value.

The above discussion has had a focus on the CVD application of a diamond material to the exterior region after the removal of the catalyst therefrom. However, it should be appreciated that other hard materials may be applied to the exterior region after the removal of the catalyst from the cutting insert.

In this regard, these hard materials may include titanium carbonitride which is applied by moderate temperature chemical vapor deposition (MTCVD) techniques. The deposition temperature for the MTCVD process is about a temperature of 850° C.

These hard materials may also include at least one of alumina, titanium nitride, titanium carbonitride or titanium carbide which is applied by plasma assisted chemical vapor deposition (PACVD). The deposition temperature for the PACVD process ranges between about 600° C. and about 700° C.

The patents and other documents identified herein are hereby incorporated by reference herein.

Other embodiments of the invention will be apparent to those skilled in the art from a consideration of the specification or practice of the invention disclosed herein. It is intended that the specification and examples be considered as illustrative only, with the true scope and spirit of the invention being indicated by the following claims.

What is claimed is:

1. A method of making a polycrystalline diamond member comprising the steps of:

providing a backing;

providing a polycrystalline diamond layer on the backing wherein the polycrystalline diamond comprises a plurality of diamond particles and a catalyst with the diamond particles being bridged together so as to form interstices therebetween and the catalyst being at the interstices of the diamond particles;

removing the catalyst from the polycrystalline diamond layer beginning at a portion of the surface of the polycrystalline diamond layer to a predetermined depth so as to form:

an exterior region comprising exterior ones of the diamond particles bridged together so as to form interstices therebetween, and the exterior region being essentially free of the catalyst, and an interior region inwardly of the exterior region, and the interior region comprising interior ones of the diamond particles and the catalyst, and the interior diamond particles being bridged together so as to form interstices therebetween, and the catalyst being at the interstices of the interior diamond particles;

depositing beginning at the portion of the surface of the polycrystalline diamond layer a volume of deposited diamond having a particle size of less than 15 micrometers and whereby the rate of deposition is sufficiently slow so as to permit the deposited diamond to infiltrate between the bridged-together diamond particles in the exterior region so as to essentially surround the exterior diamond particles whereby the exterior region comprises exterior diamond particles bridged together with the deposited diamond essentially surrounding the exterior diamond particles; and at least some of the exterior diamond particles protruding from the surface of the polycrystalline diamond layer whereby the surface of the polycrystalline diamond layer has a surface roughness of greater than 15 microinches, $R_a$.

2. The method according to claim 1 wherein the removing step comprises an acid treatment.

3. The method according to claim 1 wherein the removing step comprises electrochemical etching.

4. The method according to claim 1 wherein the polycrystalline diamond layer has a rake surface and a flank surface, and the removing step includes removing the catalyst at the rake surface.

5. The method according to claim 4 wherein the removing step further includes removing the catalyst at the flank surface.

6. The method according to claim 1 wherein the depositing step has a desposition rate of less than one micron per hour.

7. The method of claim 6 wherein the depositing step utilizes a chemical vapor deposition technique.

8. The method according to claim 7 wherein the deposition temperature is less than or equal to about 850° C.

9. The method of claim 6 wherein the depositing step utilizes a microwave plasma technique.

10. The method of claim 6 wherein the depositing step utilizes a hot filament chemical vapor deposition technique.

11. The method of claim 1 wherein the deposited diamond comprises deposited diamond particles, the deposited diamond particles being of an average grain size less than an average grain size of the exterior diamond particles.

12. A method of making a polycrystalline diamond member comprising the steps of:

providing a backing;

providing a polycrystalline diamond layer on the backing wherein the polycrystalline diamond comprises a plurality of diamond particles and a cobalt-based catalyst with the diamond particles being bridged together so as to form interstices there between and the cobalt-based catalyst being at the interstices of the diamond particles;

removing the cobalt-based catalyst from the polycrystalline diamond layer beginning at a portion of the surface of the polycrystalline diamond layer to a predetermined depth so as to form:

an exterior region comprising exterior ones of the diamond particles bridged together so as to form interstices there between, and the exterior region being essentially free of the cobalt-based catalyst, and an interior region inwardly of the exterior region, and the interior region comprising interior ones of the diamond particles and the cobalt-based catalyst, and the interior diamond particles being bridged together so as to form interstices there between, and the cobalt-based catalyst being at the interstices of the interior diamond particles;

depositing beginning at the portion of the surface of the polycrystalline diamond layer a volume of hard material having a particle size of less than 15 micrometers and whereby the rate of deposition is sufficiently slow so as to permit the hard material to infiltrate between the bridged-together exterior diamond particles in the exterior region so as to essentially surround the exterior diamond particles whereby the exterior region comprises diamond particles bridged together with the hard material essentially surrounding the exterior diamond particles; and at least some of the exterior diamond particles protruding from the surface of the polycrystalline diamond layer whereby the surface of the polycrystalline diamond layer has a surface roughness of greater than 15 microinches, $R_a$.

13. The method according to claim 12 wherein the hard material comprises CVD diamond particles.

14. The method according to claim 13 wherein the exterior diamond particles are of a first average grain size and the CVD diamond particles are of a second average grain size that is different from the first average grain size.

15. The method according to claim 14 wherein the first average grain size is greater than the second average grain size.

16. The method according to claim 13 wherein there are essentially no voids between the exterior diamond particles.

17. The method according to claim 13 wherein the polycrystalline diamond layer has a rake surface, and at least some of the exterior diamond particles near the rake surface of the polycrystalline diamond layer protrude from the rake surface.

18. The method according to claim 12 wherein the flank surface of the polycrystalline diamond layer has a surface roughness of less than about 5 microinches, $R_a$.

19. The method according to claim 13 wherein the exterior region has a thickness of between 10 and 15 microns.

20. The method according to claim 13 wherein the depositing step has a rate of deposition less than one micron per hour.

21. The method according to claim 13 wherein the depositing step has a rate of deposition less than 0.5 micron per hour.

* * * * *